United States Patent
Sutardja

(10) Patent No.: US 12,306,660 B2
(45) Date of Patent: May 20, 2025

(54) ULTRA-LOW POWER D FLIP-FLOP WITH REDUCED CLOCK LOAD

(71) Applicant: Sehat Sutardja, Las Vegas, NV (US)

(72) Inventor: Sehat Sutardja, Las Vegas, NV (US)

(*) Notice: Subject to any disclaimer, the term of this patent is extended or adjusted under 35 U.S.C. 154(b) by 118 days.

(21) Appl. No.: 18/212,101

(22) Filed: Jun. 20, 2023

(65) Prior Publication Data

US 2023/0409073 A1  Dec. 21, 2023

Related U.S. Application Data

(60) Provisional application No. 63/354,129, filed on Jun. 21, 2022.

(51) Int. Cl.
*G06F 1/08* (2006.01)

(52) U.S. Cl.
CPC ...................... *G06F 1/08* (2013.01)

(58) Field of Classification Search
CPC .......................................................... G06F 1/08
See application file for complete search history.

(56) References Cited

U.S. PATENT DOCUMENTS

| | | | |
|---|---|---|---|
| 7,908,500 B2 | 3/2011 | Westwick et al. | |
| 8,880,965 B2 | 11/2014 | Zhang et al. | |
| 9,310,435 B2 * | 4/2016 | Chen | G01R 31/31725 |
| 11,726,141 B2 * | 8/2023 | Kang | G11C 7/222 |
| | | | 327/202 |
| 2006/0152267 A1 * | 7/2006 | Ramprasad | H03K 3/356 |
| | | | 327/208 |
| 2007/0229133 A1 * | 10/2007 | Tam | H03K 3/356043 |
| | | | 327/218 |
| 2013/0147534 A1 * | 6/2013 | Cheng | H03K 3/35625 |
| | | | 327/202 |
| 2019/0058461 A1 * | 2/2019 | Agarwal | H10B 10/12 |
| 2019/0109586 A1 * | 4/2019 | Lee | H03K 3/0372 |
| 2019/0356313 A1 * | 11/2019 | Venugopal | H03K 3/0375 |
| 2021/0167761 A1 * | 6/2021 | Liu | H03K 3/356156 |

FOREIGN PATENT DOCUMENTS

| | | |
|---|---|---|
| CN | 108540110 | 9/2018 |
| CN | 105897221 | 6/2020 |

* cited by examiner

*Primary Examiner* — Zahid Choudhury
(74) *Attorney, Agent, or Firm* — Command IP LLP; Pejman Yedidsion

(57) ABSTRACT

A latch for a flip-flop or other circuit which requires fewer signal inputs than prior latch designs to reduce power consumption. The latch comprises a first transistor set is switching element and is configured to receive clock signals from a clock network and an input signal. A second transistor receives the input signal from the first transistor set and is configured as a first data buffer to create a latch output. A feedback path includes a third transistor set in series with a resistor or transistor pair. The feedback path receives the latch output and generates a feedback signal, which is provided to the first transistor set. The resistor or transistor pair is selected to establish the feedback signal at a magnitude that is sufficiently large to maintain the state of the latch but sufficiently small to allow a change in the input signal to change the latch output.

19 Claims, 6 Drawing Sheets

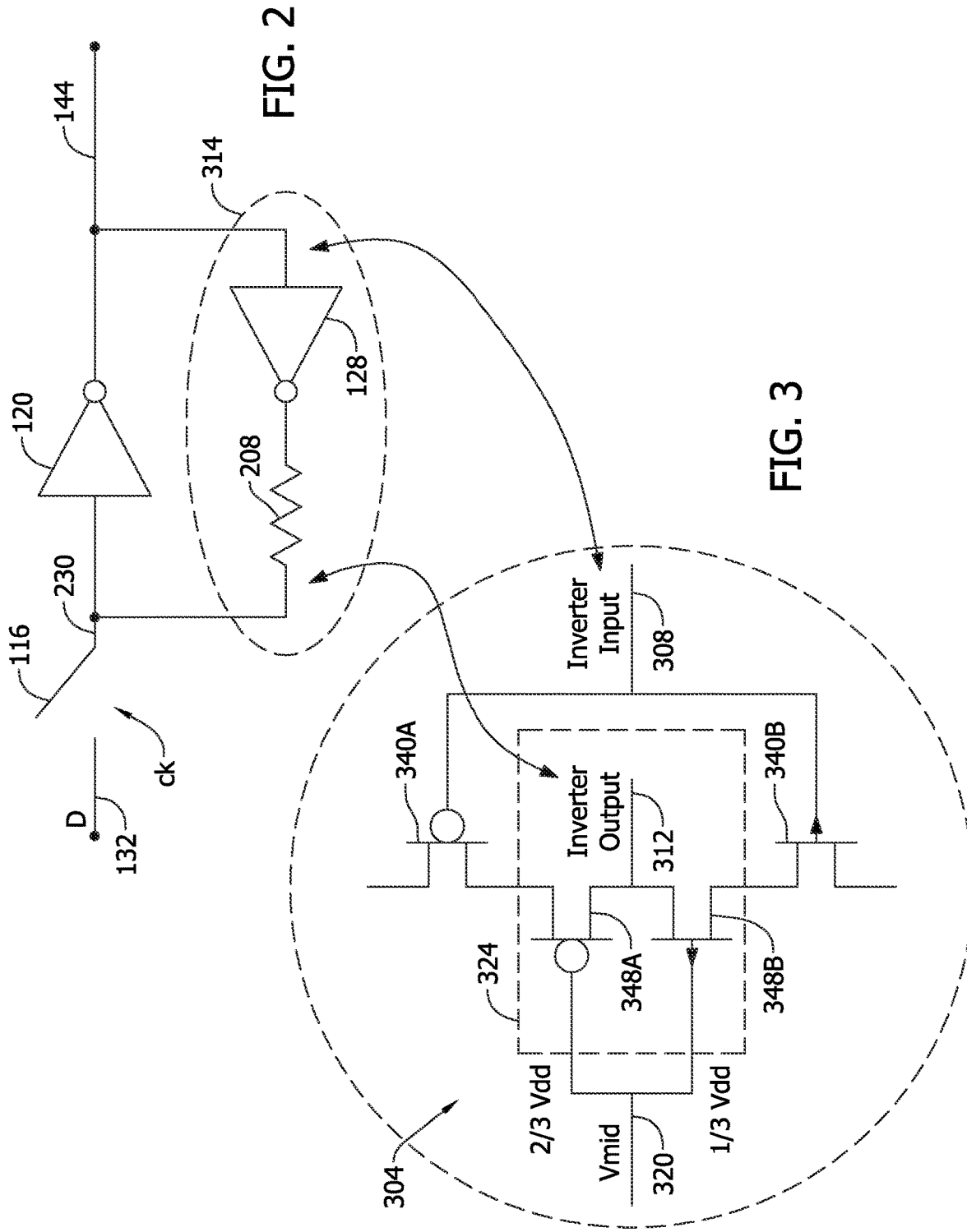

ULTRA-LOW POWER D FLIP-FLOP WITH REDUCED CLOCK LOAD

1. FIELD OF THE INVENTION

The invention relates to D flip-flops and in particular a D flip-flop with ultra-low power consumption and reduced input clock load.

2. RELATED ART

A D flip-flop (DFF) cell is an essential building block for any sequential digital logic function. In high performance highly pipelined microprocessors/GPU's/AI processors DFF cells often constitute up to 30% of the overall chip transistor counts. Not surprisingly the energy consumption of a high-performance processor is significantly influenced by the energy efficiency of the DFF cells. FIG. 1A illustrates a functional representation of a D flip-flop. The D flip-flop 150 includes a data input 154, a clock input 156 and, in this embodiment complementary outputs 158A, 158B. Operation of prior art D flip-flop 150 is known by those ordinary skill in the art.

To understand where energy is being dissipated in a DFF, it is helpful to further understand the simplified topology of the D flip-flop shown in FIG. 1A. As compared to FIG. 1A, identical elements are labeled with identical reference numbers. In FIG. 1B there is a primary (master) latch 170 and a secondary (slave) latch 174. These often have a generally similar layout. Within for example, the master latch 170, there are numerous logic devices such as NAND elements 162, 164, 180, 182. Each of these NAND gates have two transistors which receive the clock signal and which have an associated capacitance, which creates a capacitive switching load on the clock or, if the clock is distributed to clock buffers (156, FIG. 1A), then the capacitive load is seen by the clock buffers (and the clock buffer itself consumes power). The clock signal is provided by a clock network.

As is well understood, each of these devices receive a clock signal to oversee and control of the device. Each clock input connects to a switching device. As with any system, to toggle the switch or change the switch state requires that the clock signal toggle from high to low, and the toggling of the clock signal consumes a very small amount of electrical energy. Stated another way, these switch states don't change state for free, i.e. without a small amount of energy input from the clock source. It takes electrical energy for the clock signal, as provided to each device in each flip flop, to transition states such as for example from a low state to a high state. Although shown in the simplified block diagram with the clock signal being fed into devices 162, 164, 180, 182 each of these devices actually has multiple switches (transistors) controlled by the clock signal, such as from device 160, which is part of the overall clock network on the chip, as is shown in detail in FIG. 1C.

The energy, in the form of electrical current/voltage is supplied from a clock source (network) or a clock buffer. Thus, each device 162, 164 in the master latch 170 has multiple switching transistors that must be toggled by the clock signal and as such the clock signal source must be sized for the number of devices it switches and consumes power during each clock cycle. The larger the number of switches that have to be toggled, the greater the amount of power that must be sourced by the clock signal network.

FIG. 1C illustrates a circuit representation of a common D flip-flop (DFF)_design. FIG. 1D illustrates a simplified version of a portion of the DFF of FIG. 1A. FIG. 1C and FIG. 1D are described together below. As shown, the DFF has a master (first) 108 flip-flop (FF or latch) and a slave (second) flip-flop (FF or latch) 112. The first FF 108 and second FF 112 are generally similar in configuration. The first FF 108 includes a data input 132 configured to receive data. The data input 132 connects to a primary path switch 116 and a primary path inverter 120. The output of the primary path inverter 120 is provided as a data output 144 and as an input to the feedback path. The feedback path includes a feedback path inverter 128 and a feedback path switch 124. The output of the feedback path switch 124 connects to a node between the primary path switch 116 and primary path inverter 120. The switches 116, 124 are controlled by clock signals.

Also provided to the switches 116, 124 are clock signals, namely ck 140A, ckb 140B such that clock signal ckb is inverted as compared to clock signal ck, such that when one is high, the other is low. DFF operation is well known in the art and as such it is not described in detail herein.

When switches 116, 124, receive the clock and clockb signals, the clock system and/or switch consumes power because transitioning the signal from a low state to a high state, or vice versa, requires energy. The clock signal controls the switches. When feedback is presented from the feedback path, there is positive feedback which maintains the state of the last input, either high or low, thus operating as a memory. Thus, it is important to have feedback to maintain the state of the data.

As is understood, the majority of the energy dissipated in a digital circuit is defined by the well-known $CV^2F$ equation where C is the total effective load capacitance that is toggling between an active high to an active low state and vice versa, V is the voltage swing seen by the load capacitance C, and F is the toggling activity (frequency). In a DFF circuit, even if there is no DFF input state transition (such as when there is no input activity) energy is nonetheless still dissipated whenever the clock signal 140 toggles. This is because to enable any DFF to change its state, a DFF must have passthrough transistors in the forward path to propagate the incoming input data through the DFF. In addition, it also must have passthrough feedback transistors (in the feedback path) to enable the internal circuit to latch (i.e., to remember) the incoming input data in the DFF when the input data no longer exists. These pass-through transistors are to be turned on or off appropriately for these actions to take hold. The process of turning on and off the passthrough transistors (switches 116, 124) are governed by the clock signal.

The passthrough transistors in the DFF are therefore the main source of energy loss. This is because a robust CMOS class of DFF design needs at least eight passthrough transistors that are connected to the clock signals (Ck and $Ck_b$). In every clock transition, energy would then be consumed by the clock network to toggle (charge and discharge) these eight passthrough transistors. Making the situation worse, the capacitance seen by the clock nodes also include the necessary wiring capacitances of the gate connections of the passthrough transistors, as well as the fact that the clock buffer circuitry must be sized up accordingly to drive these eight passthrough transistors with reasonably fast slew rates to guarantee proper operation of the DFF (such as to prevent a race condition).

While each individual flip-flop does not consume much power, the total power consumed can be large due to the number of flip-flops used in a computer or modern computing system and clock speeds. For example, there may be billions of flip-flops in a computer system, and with clock speeds in the gigahertz range, the billions of flip-flop transistor switches are switching billions of times per second. Thus, even though the power consumption during each flip-flop clock cycle is small, when multiplied over billions of flip-flops and billions of clock transitions per second, the amount of power consumed is significant.

In addition, as semiconductor processes advance, the size of each transistor becomes smaller and smaller. Due to the high operating speeds and the small, thin trace dimensions, electromigration because more prevalent. In addition, as semiconductor devices are designed with a greater number of devices (transistors), the burden on the clock network (source) to drive the numerous semiconductor switches becomes greater which also increases electromigration. Electromigration leads to system glitches and eventually failure of the device, and as such it is a serious problem. The disclosed innovation reduces electromigration by reducing the current sourcing requirements of the clock network.

SUMMARY

To overcome the drawbacks of the prior art, a D flip-flop with reduced clock network loading connections is disclosed. In one embodiment the D flip-flop comprises a master latch and a slave latch. The master latch comprises a first transistor set configured as a switching element. The first transistor set is configured to receive one or more clock signals from a clock network and an input signal. A second transistor set is configured as an inverter. The second transistor set is configured to receive the input signal from the first transistor set responsive to the one or more clock signals, and create a master latch output. Also part of the master latch are a third transistor set and a fourth transistor set. The third transistor set is configured to receive a gate voltage that causes the transistors in the third transistor set to be weakly on to provide a feedback signal to the second transistor set. The fourth transistor set is configured as an inverter, wherein at least one of the weakly on transistors in the third transistor set is in series with at least one transistor in the fourth transistor set. The third transistor set and the fourth transistor set do not receive the one or more clock signals, which reduces the load on the clock network.

The slave latch comprises a fifth transistor set functioning as a switching element. The fifth transistor set is configured to receive the one or more clock signals and the master latch output. A sixth transistor set functions as an inverter. The sixth transistor set is configured to receive the master latch output from the fifth transistor set responsive to the one or more clock signals, and create a slave latch output. A seventh transistor set and an eighth transistor set is also part of the slave latch. The seventh transistor set receives a gate voltage that causes transistors in the seventh transistor set to be weakly on to provide a feedback signal to the sixth transistor set. The eighth transistor set is configured as an inverter, such that at least one of the weakly on transistors in the seventh transistor set is in series with at least one transistor in the eighth transistor set. The seventh transistor set and the eighth transistor set do not receive the one or more clock signals.

In one embodiment, the gate voltage comprises 50% of a supply voltage. It is contemplated that the third transistor set may comprise two transistors, such that the two transistors having gate terminals that receive a gate voltage that is a fraction of a supply voltage value. In one configuration, a first transistor of the third transistor set receives a gate voltage signal that is generally ⅓ of the supply voltage value and another transistor of the third transistor pair receives a gate voltage that is generally ⅔ of the supply voltage value. In one embodiment, the feedback signal is sufficiently large to maintain a state of the flip-flop while also sufficiently small to be overcome by a change in state of the input signal thereby allowing the input signal to change the state of the flip-flop. As discussed herein, the third transistor set and the fourth transistor set not receiving the one or more clock signals results in reduced power use of a clock network which supplies the one or more clock signals to the D flip-flop as compared to the prior art.

Also disclosed is a method of operation of a flip-flop latch comprising receiving a clock signal and a latch input signal at a latch input. The latch input signal is at a first state. Then creating an inverted version of the input signal. Thereafter, providing the inverted version of the input signal to a feedback path and to a latch output. This method also generates a feedback signal within the feedback path and provides the feedback signal to the latch input. The feedback signal is at a voltage sufficiently large to maintain a state of the latch while also sufficiently small to be overcome by a change in state of the input signal to a second state, thereby changing the latch output. In this embodiment, the feedback path does not receive the clock signal. Then, providing the feedback signal to the input of the latch to maintain the state of the latch at the first state until the state of the input signal changes.

The state of the input signal may be a logic level high or a logic level low. In one embodiment, the clock signal consists of a clock signal and an inverted version of the clock signal. In one configuration, the feedback signal is at a voltage that is 50% a latch supply voltage. The feedback path may comprise an inverter in series with a resistor. It is also contemplated that the feedback path may comprise a first transistor set and a second transistor set. The first transistor set is configured with transistors that receive a gate voltage that causes transistors in the first transistor set to be weakly on to output the feedback signal from the feedback path. The second transistor set may be configured as an inverter or buffer, wherein at least one of the weakly on transistors is in series with at least one transistor in the second transistor set and the first transistor set and the second transistor set do not receive the clock signal. As discussed herein, the feedback path not receiving the clock signal reduces power draw from a clock network which supplies the clock signal.

Also disclosed and described is a latch for use in a flip-flop comprising a first transistor set configured as a switching element, a second transistor set configured as first data buffer, and a feedback path. The first transistor set is configured to receive clock signals from a clock network and an input signal. The second transistor set configured to receive the input signal from the first transistor set responsive to the clock signals, and create a latch output. The feedback path comprises a third transistor set in series with a resistor. The third transistor set is configured as a second data buffer and the feedback path receives the latch output and generates a feedback signal, with the third transistor set and the resistor. The feedback signal is provided to the first transistor set, such that the resistor is selected to establish the feedback signal at a magnitude that is sufficiently large to maintain the state of the latch while also being sufficiently small to allow a change in the input signal to change a state of the latch.

In one embodiment, the resistor replaces two switching transistors which reduces power draw from a clock network, the clock network generating the one or more clock signals. The first data buffer and the second data buffer may be inverters. The latch may further comprise a second latch, such that the latch of claim 14 and the second latch form a D flip-flop. It is contemplated that the magnitude of the feedback signal is 50% of a supply voltage for the latch. In one configuration, the latch has only two transistors which receive the clock signals.

Other systems, methods, features, and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

FIG. 2 illustrates an alternative embodiment of a portion of a D flip-flop with a resistor in the feedback path.

FIG. 3 illustrates an alternative embodiment of a low power feedback path of a D flip-flop.

DETAILED DESCRIPTION

To overcome the drawbacks of the prior art and provide additional benefits, a new ultra-low power DFF topology having a much lower capacitive load on the clock network is disclosed and is shown in the Figures and discussed herein.

Figure 1A:
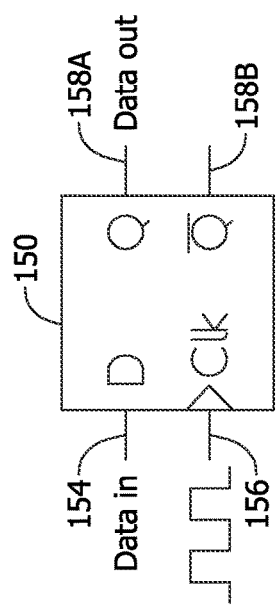
FIG. 1A illustrates an example D flip-flop symbol.
Figure 1B:
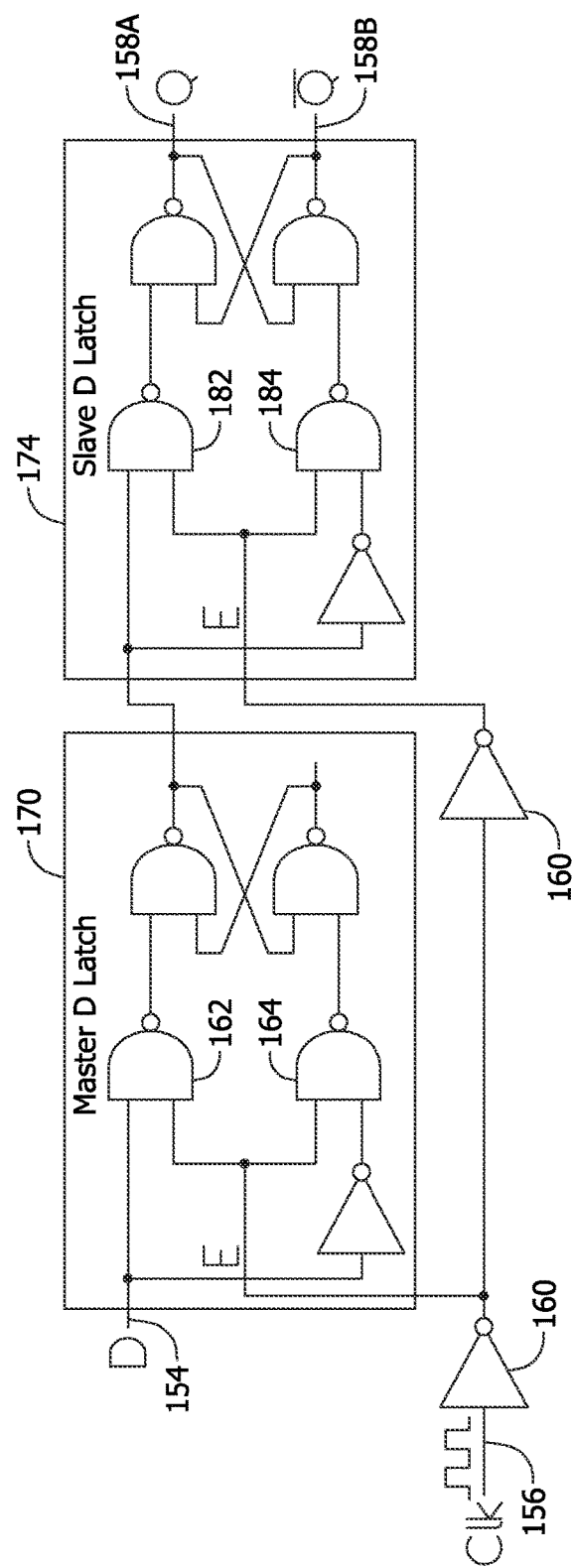
FIG. 1B illustrates a block diagram of an example embodiment of prior art D flip-flop.
Figures 1C, 1D:
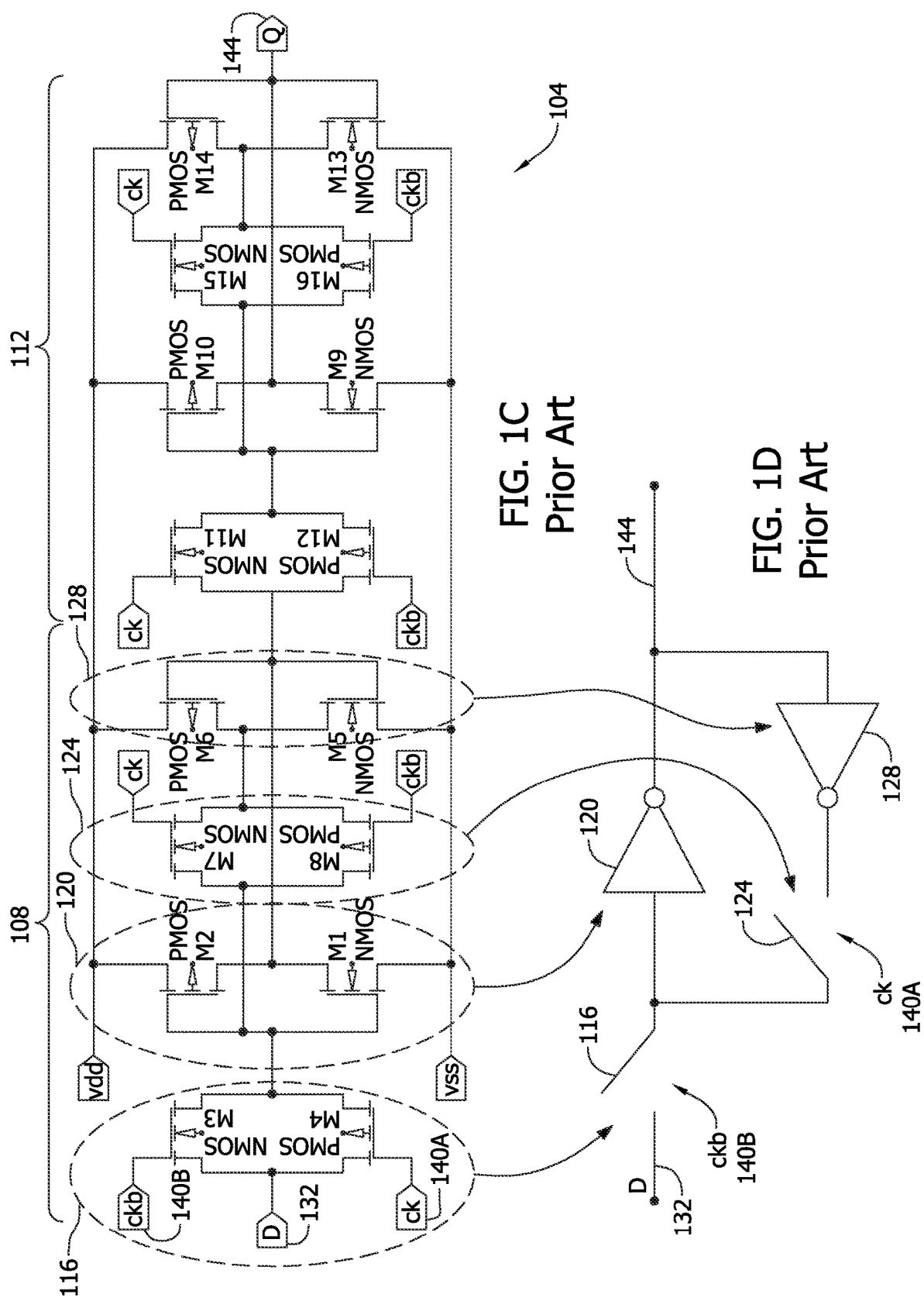
FIG. 1C illustrates an example embodiment of a prior art D flip-flop implementation.
FIG. 1D illustrates a simplified version of a portion of the prior art D flip-flop shown in FIG. 1A.

As shown in FIG. 2, the inventor realized that while the primary path switch is needed to clock data into the flip-flop, the feedback path may present an opportunity to reduce power consumption without any drawbacks to operation. Conceptionally, it is possible to replace the feedback path switch 124 (FIGS. 1A, 1B) with a resistor 208. The resistor 208 would be sized to provide a weak feedback signal to the input of the inverter 120, sufficient to maintain the flip-flop state, while still reducing power consumption of the feedback path. By replacing the switch 124, and its associated transistors and clock signal inputs, with a resistor, power is reduced by eliminating these power consuming transistors and associated clock transitions provided to the feedback path. While conceptually functional, a large resistance value would be required, and it is not feasible to construct the preferred resistance is existing semiconductor processes. For example, the resistor may be in the order of mega-Ohms of resistance, which is challenging to implement in typical semi-conductor processes.

FIG. 3 illustrates an example embodiment of a low power consumption feedback path. This is but one possible circuit configuration of a low power flip-flop feedback path with transistors in the feedback path. The feedback structure 304 replaces the feedback path 314. In this embodiment, a feedback path input 308 (same node at output node 144 of FIG. 2) connects to the gate terminal of a first group of CMOS transistors, namely a PMOS transistor 340A and an NMOS transistor 340B. A second group of transistors 324 connects to the transistors 340A, 340B as shown. The second group of transistors 324 includes a PMOS transistor 348A and a NMOS transistor 348B.

A feedback path 314 (and in particular, inverter output 312) is provided as shown and would connect back to the primary signal path at node 230 (FIG. 2) to provide a weak feedback signal sufficient to maintain the state of the flip-flop. The term 'weak feedback signal' may be defined in terms of Vgs (voltage gate to source) of devices 348A, 348B, such that a larger Vgs value is defined as stronger on, and a smaller Vgs value is defined as weaker on. For example, Vgs is Vdd minus Vmid. In one configuration a Vgs value of 50% or less establishes the transistor as weakly on. This is contrary to accepted design principles, which usually use the FET as a switching device, which is to say fully on or fully off. In one embodiment, 'weakly on' is defined as a Vgs of 20% to 50% of the maximum Vgs value. If the Vgs value is too low, then the transistor will not be on, meaning it will be off all the time and not provide the required feedback. These values are ranges and so deviation from this range, such as 18% to 19% would likely still be weakly on (not off), and 51% to 55% would likely still be operational, although likely less ideal. In other embodiments, Vgs should be greater than Vt (threshold voltage) of devices 348A, 348B, and Vgs minus Vt should be less than 1/N of Vdd where N is 3 or 4 or where N is 2.1 to 5. In addition, the strength of transistor is defined as the square of (Vgs−Vt). If the transistor is too weak, then the device will be too slow, such as in a poorly designed circuit a 1 Ghz circuit may have a 1 ms response time, which is much too slow.

In reference to the enlarged portion of the feedback path 314 (also referenced as structure 304), a gate voltage is provided to the gate terminals of the second group of transistors 324. The gate voltage may be Vmid, which is approximately 50% of Vdd (the supply voltage for the flip-flop) or the PMOS transistor 348A may receive a larger voltage, such as for example, ⅔ Vdd while the NMOS transistor 348B receives a smaller voltage, such as for example, ⅓ Vdd. This establishes the feedback device 304 as less strongly on (more weakly) as compared to use of Vmid. It is also contemplated that voltage values may be swapped with transistor 348A receiving ⅓ Vdd and transistor 348B receiving ⅔ Vdd which results in the feedback device 304 being more strongly on as compared to the use of Vmid. The feedback signal must not be made to be so high (strongly on) that the inputs signal (D) can not overcome the feedback signal to transition the flip flop. Stated another way, for the PMOS device the Vgs should be more negative than the negative Vt value to turn on the PMOS device. For the NMOS device the Vt is positive and the device requires a Vgs that is larger than the Vt value to turn on the NMOS device, but not so large that a change in the input signal (D) will not change the flip-flop state. Otherwise, if Vgs is not greater than Vt, these devices 348A, 348B will not turn on and provide the feedback signal.

The voltage Vmid (or ⅓ Vdd/⅔ Vdd) is held constant during operation, and not transitioning up and down. The devices 348A, 348B do not consume power when presented with the signal Vmid (or ⅓ Vdd/⅔ Vdd) since the gates of the transistors 348A, 348B have a very, very high input impedance (may be referred to as infinite input impedance) thus resulting in no current flow into these transistors. These voltages (Vmid, ⅓ Vdd, ⅔ Vdd) are exemplary such that other voltage magnitudes may be presented, so long as the magnitudes generate a feedback voltage to node 230 that is sufficient to maintain the state of the flip-flop but is not so large that it is not overpowered by a change in the input signal at input node 132. This is referred to herein as weakly on. To be clear, the feedback signal has to be at a magnitude (or below) such that a change in the input signal (D input) in relation to the feedback signal is able overcome the effect of the weak feedback signal, so that the flip-flop state will change.

The Vmid voltage (or ⅓ Vdd, ⅔ Vdd, or some similar variation) may be created by a voltage divider network, such as using resistors, switch capacitor divider, or any other circuit to create the signals. It is contemplated that Vdd may be preferred as it may be the least complicated to create. It is contemplated that Vdd is the supply voltage, and that value of the input signal (D) may be full rail, which is from zero volts to Vdd.

The configuration of FIG. 3 has numerous advantages. Primarily, it consumes little to no power which is a significant advantage over the prior art. While there are four transistors, the feedback path does not receive the clock signal and thus the clock signal driver does need to be sized and configured to drive the feedback path switches, which saves power. In addition, the transistors are maintained as weakly on (and are not switching on/off) and as such, do not consume power. In addition, it does not increase consumed space, nor detrimentally affect circuit operation.

Figure 4A:
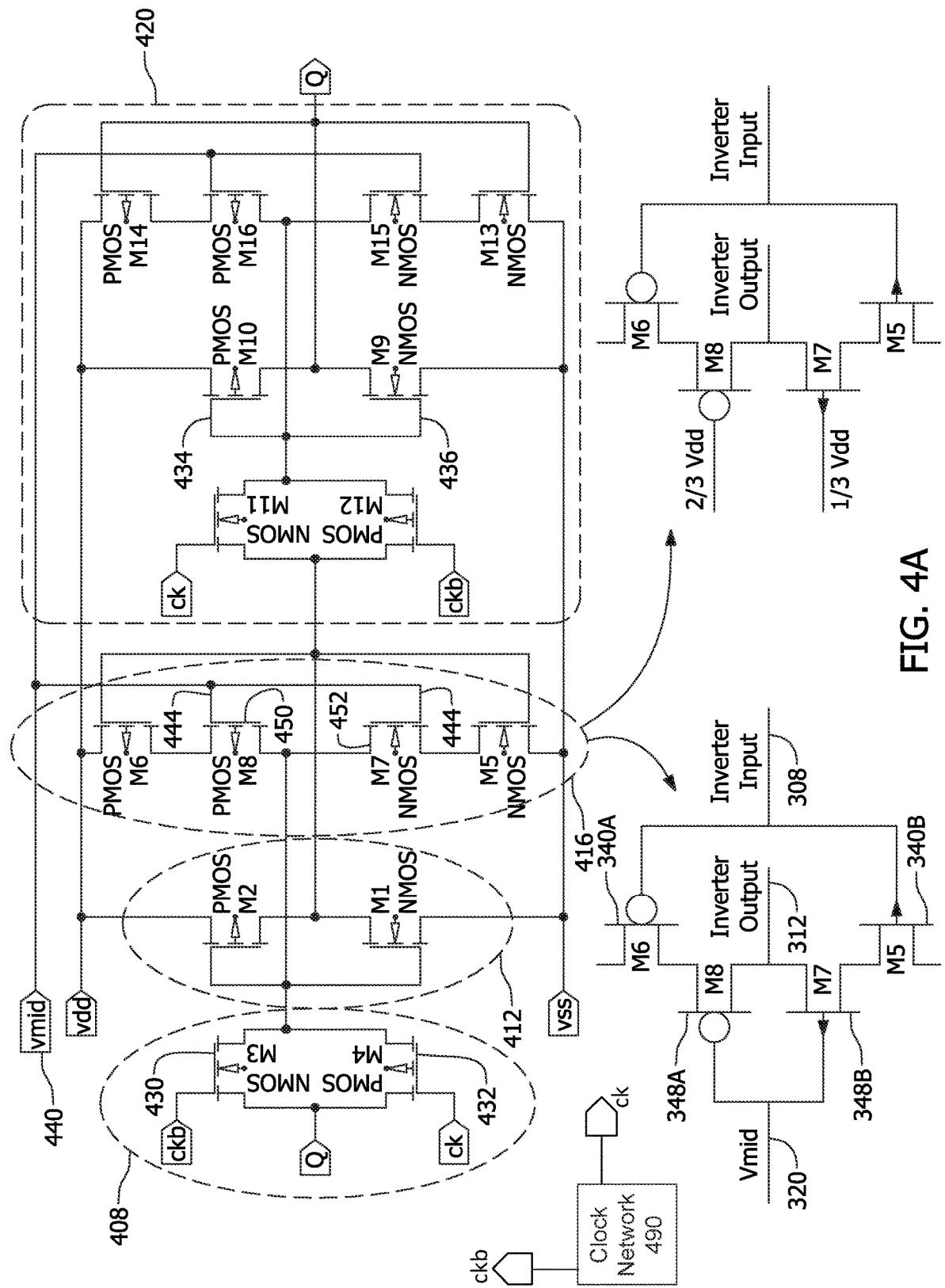
FIG. 4A illustrates a circuit diagram of a low power, D flip-flop based on the innovation disclosed herein.

FIG. 4A illustrates the feedback configuration of FIG. 3 in a D flip-flop circuit. This is but one possible D flip-flop circuit configuration and as such, other configurations are possible. As shown, the circuit includes a primary path switch 408, a primary path inverter 412, and the feedback path 416. The slave (second) flip-flop 420 is similarly configured as elements 408, 412, 416. The number of passthrough transistors which are connected to the clock input signal(s) is reduced to just four transistors 430, 432, 434, 436 while still maintaining the static DFF property of the original DFF using the traditional eight passthrough transistors. A clock network 490 generates the clock signals, such as ck and ckb signals. The clock network 490 is also present in other embodiments (figures) although not shown. The clock network 490 must be sized and configured to have capability to drive the various clock inputs throughout the circuit or chip (die). The greater the number of transistors or devices which must be switched or control by the clock signal, the larger the clock network 490 must be, and the more power is consumed by the clock network.

Reducing the number of passthrough transistors that are connected to the clock network (source) by 50% results in the clock network having to drive or switch fewer devices. As a result, the clock network can be down sized (made smaller) by 50% due to the reduced clock load. As a result, the energy dissipated by the DFF passthrough transistors and the DFF clock buffer (not shown in FIG. 4A) is lowered by 50%, due to the reduced electrical burden on the clock network. Likewise, electromigration is reduced in modern small devices made with current processes, that are fabricated in the nanometer scale, due to the reduced current flow therethrough. For example, if the energy (current flow) by a factor of two, then electromigration is reduced exponentially. By way of example, for a modern semiconductor chip containing a billion flip-flop latches, reducing the demand on the clock by ½ is a significant reduction if power demands on the clock, particularly when the clock is operating in the gigahertz range.

In addition, the energy wasted in the global chip clocking network would be reduced by 50% as well. Since the global clocking energy consumption alone often exceeds 20% of the overall chip power and because up to 30% of modern chip area comprises of DFF cells, by replacing the normal DFF with this new DFF would reduce the overall chip power by 25% or more. This is a significant improvement over the prior art.

As shown in the circuit of FIG. 4A, to maintain the feedback connections inside the DFF, the gate connections 444 in the feedback passthrough transistors are moved from the clock nodes to a fixed supply voltage $V_{mid}$ 440 (approximately the midpoint of the supply voltage for simplicity). Other generated voltages such as ⅓ Vdd for the NMOS passthrough transistors and ⅔ Vdd for the PMOS passthrough transistors would work as well or even work slightly better albeit, at a slight increase in complexity. By connecting both the gates 444 of the PMOS 450 and NMOS 452 passthrough transistors to $V_{mid}$ 440, both the PMOS and NMOS feedback passthrough transistors would essentially be in an always on condition. This may appear to violate the most basic digital circuit design principle, which is that all digital transistors in a CMOS design must be either fully on or off. However, contrary to accept design principles, in this design, because the passthrough transistors are connected to $V_{mid}$ 440, the strengths of the feedback passthrough transistors 450, 452 are effectively just made to be barely always on. This is because in today's advanced CMOS process nodes the nominal power supply voltage is typically only about three times as large as the MOS transistor threshold voltages ($V_t$); which results in a condition where the gate to source overdrive voltage (commonly defined at $V_{gs}-V_t$) of the always on feedback pass transistors 450, 452 to be only set at $V_{dd}/2-V_t$ or essentially only 50% of $V_t$ when $V_{dd}=3*V_t$.

Due to the square law property of MOS transistors, a 75% reduction in the gate to source overdrive values causes the always on transistors to be barely on by at least an order magnitude weaker than that of the normally fully on transistors. As a result, for practical purposes, the circuit that is trying to flip the state of the DFF would now only encounter a barely on passthrough transistors in its forward path, thus allowing the changing input signal to easily overcome any resistance for changing the DFF state.

In ultra-low voltage applications such as, but not limited to, battery operated IOT (internet of things) devices, and even in ultra-low power powerline operated bitcoin mining chips the newly introduced low power DFF technique would save even more power as the always on feedback passthrough transistors would now basically operate in deep subthreshold region. This essentially turns the passthrough transistors 450, 452 to be super high impedance passthrough devices. As the pass-through transistors 450, 452 are placed in series with the feedback transistors, this would also reduce the crowbar current to essentially zero. While at the same time still allowing the passthrough transistors 450, 452 to provide replenishing current to combat any leakage current at the input of the inverters inside the DFF circuit.

Figure 4B:
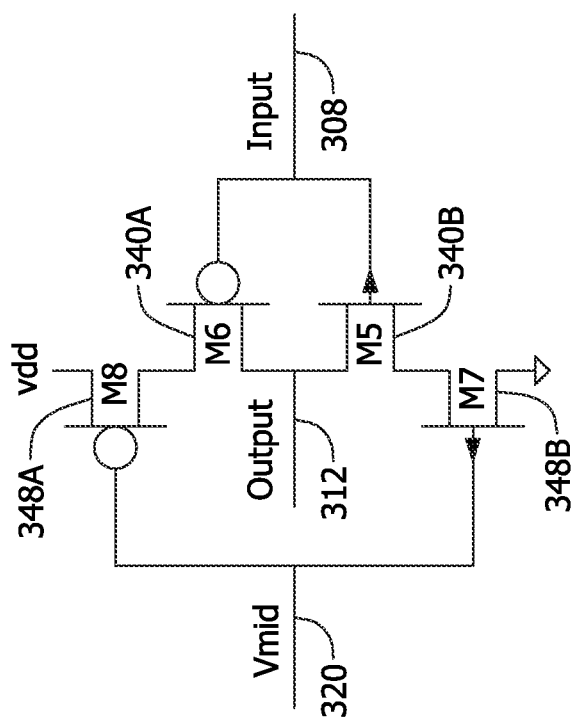
FIG. 4B illustrates an alternative embodiment of the feedback path.

FIG. 4B illustrates an alternative embodiment of the feedback path. In this figure, as compared to FIGS. 3 and 4A, identical elements are labeled with identical reference numbers. FIG. 4B illustrates an alternative embodiment with a different transistor layout. As shown, the position of the weakly on transistors 348A, 348B are moved to the upper and lower positions while the transistors 340A, 340B which function as an inverter pair are moved to the inner positions. As shown, transistors 348A is in series with transistor 340A and transistor 348B is in series with transistor 340B. This is but one possible alternative circuit configuration and it is contemplated that numerous other circuit designs are possible which realize the benefit of providing a weak feedback signal to reduce the load on the clock network.

Alternative Embodiments of Always-on Passthrough Feedback Transistors

Figure 5:
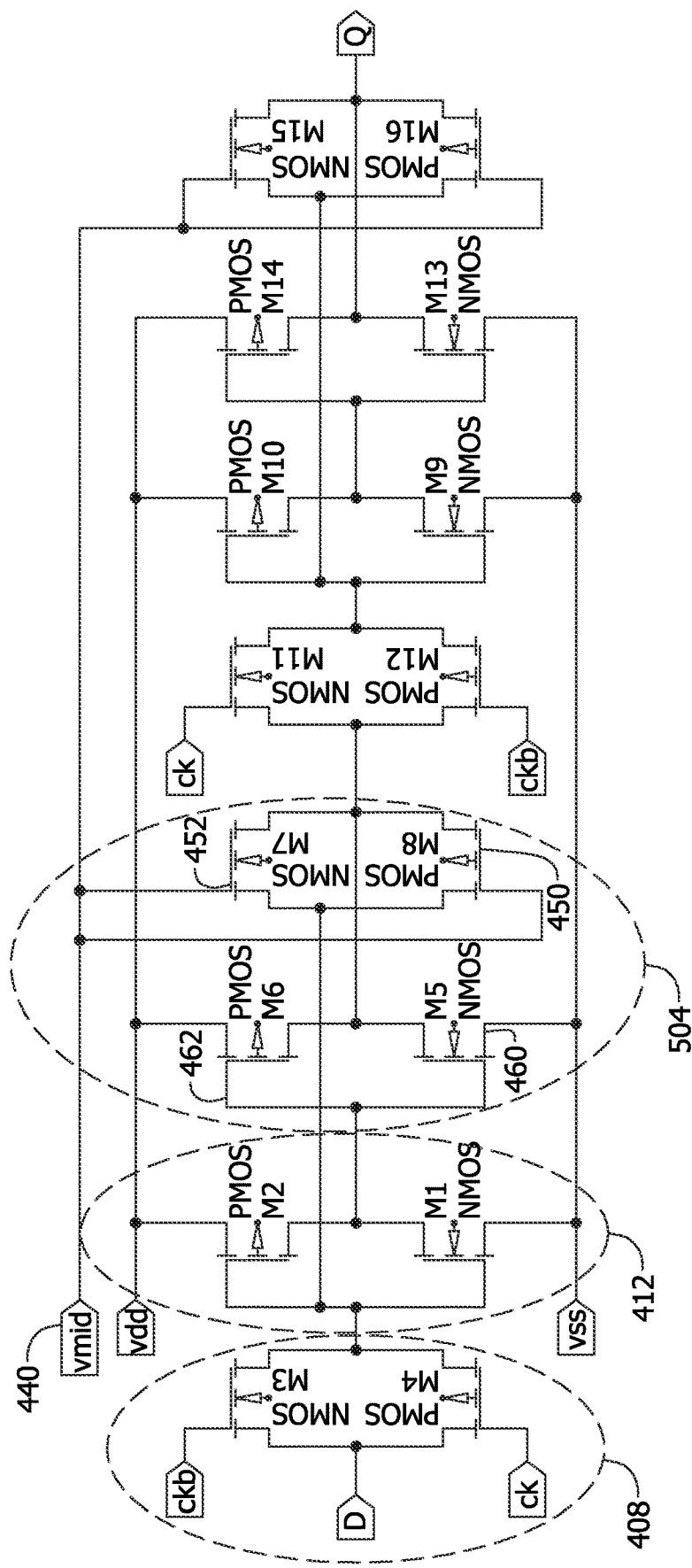
FIG. 5 illustrates an alternative embodiment of low power flip-flop feedback path.

While the feedback passthrough transistors 450, 452 shown in FIG. 4A are stacked in series with the drain of the actual feedback transistors, a reversed stacking topology is also possible. FIG. 5 illustrates an alternative embodiment of low power flip-flop feedback path. As compared to FIG. 4A, generally similar elements are labeled with identical reference numbers. As shown in FIG. 5, the two NMOS devices 452, 460 are configured in series and the two PMOS 450, 462 devices are flipped and in series. Figure also shows another possible $V_{mid}$ 440 connection for the always on feedback passthrough transistors. In this case, the always on feedback passthrough transistors 450, 452 are configured as a normal complementary parallel connected passthrough transistors but with both gates of the NMOS and PMOS transistors shorted to $V_{mid}$ 440. Such a topology has a benefit in that, in the forward signal path, there are two inverter gate delays which reduce the chance of a race condition due to a possible clocking network imbalance. It also allows the first stage of the inverters in the forward path to be sized down to a minimum to reduce the DFF input load capacitance to a minimum.

Improving the DFF Maximum Clock Frequency Operation

To improve the performance of the DFF in a situation where the DFF is operated close to the subthreshold operation level, the clock buffer in the DFF could be made to use MOS transistors with a slightly lower threshold voltage. This ensures a faster slew rate of the clock signals inside the DFF cell. The lower threshold voltage in the clock buffer would increase device leakage but for applications where the clock is always toggling the overall power dissipation of the DFF would still be lower when compared to the option of using larger devices but a normal threshold voltage for the clock buffer.

Half Latch Application

The weakly always-on feedback passthrough topology is also suitable for use in latch elements. This is basically half of the DFF circuit. Half latch is a very useful element to replace or supplement small SRAM building blocks in complex digital circuits. Because small SRAM building blocks are used so often in modern parallel processors (such as but not limited to AI processors), using half latch with the barely always on feedback circuit would drastically reduce the overall chip power.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A D flip-flop with reduce clock network loading comprising:
   a master latch comprising:
      a first transistor set configured as a switching element, the first transistor set configured to receive one or more clock signals from a clock network and an input signal;
      a second transistor set configured as an inverter, the second transistor set configured to receive the input signal from the first transistor set responsive to the one or more clock signals, and create a master latch output;
      a third transistor set configured to receive a gate voltage that causes transistors in the third transistor set to be weakly on to provide a feedback signal to the second transistor set;
      a fourth transistor set configured as an inverter, wherein at least one of the weakly on transistors in the third transistor set is in series with at least one transistor in the fourth transistor set and the third transistor set and the fourth transistor set do not receive the one or more clock signals;
   a slave latch comprising:
      a fifth transistor set functioning as a switching element, the fifth transistor set configured to receive the one or more clock signals and the master latch output;
      a sixth transistor set functioning as an inverter, the sixth transistor set configured to receive the master latch output from the fifth transistor set responsive to the one or more clock signals, and create a slave latch output;
      a seventh transistor set configured to receive a gate voltage that causes transistors in the seventh transistor set to be weakly on to provide a feedback signal to the sixth transistor set; and
      an eighth transistor set configured as an inverter, wherein at least one of the weakly on transistors in the seventh transistor set is in series with at least one transistor in the eighth transistor set and the seventh transistor set and the eighth transistor set do not receive the one or more clock signals.

2. The D flip-flop of claim 1 wherein the gate voltage comprises 50% of a supply voltage.

3. The D flip-flop of claim 1 wherein the third transistor set comprise two transistors, the two transistors having gate terminals that receive a gate voltage that is a fraction of a supply voltage value.

4. The D flip-flop of claim 1 wherein a first transistor of the third transistor set receives a gate voltage signal that is generally ⅓ of the supply voltage value and the other transistor of the third transistor pair receives a gate voltage that is generally ⅔ of the supply voltage value.

5. The D flip-flop of claim 1 wherein the feedback signal is sufficiently large to maintain a state of the flip-flop while also sufficiently small to be overcome by a change in state of the input signal thereby allowing the input signal to change the state of the flip-flop.

6. The D flip-flop of claim 1 wherein the third transistor set and the fourth transistor set not receiving the one or more clock signals results in reduced power use of a clock network which supplies the one or more clock signals to the D flip-flop as compared to the prior art.

7. A method of operation of a flip-flop latch comprising:
receiving a clock signal and a latch input signal at a latch input, the latch input signal at a first state;
creating an inverted version of the input signal;
providing the inverted version of the input signal to a feedback path and to a latch output;
generating a feedback signal within the feedback path and providing the feedback signal to the latch input, the feedback signal at a voltage sufficiently large to maintain a state of the latch while also sufficiently small to be overcome by a change in state of the input signal to a second state thereby changing the latch output, wherein the feedback path does not receive the clock signal; and
providing the feedback signal to the input of the latch to maintain the state of the latch at the first state until the state of the input signal changes.

8. The method of claim 7 wherein the state of the input signal is a logic level high or a logic level low.

9. The method of claim 7 wherein the clock signal consists of a clock signal and an inverted version of the clock signal.

10. The method of claim 7 wherein feedback signal is at a voltage that is 50% a latch supply voltage.

11. The method of claim 7 wherein the feedback path comprises an inverter in series with a resistor.

12. The method of claim 7 wherein the feedback path comprises a first transistor set configured with transistors that receive a gate voltage that causes transistors in the first transistor set to be weakly on to output the feedback signal from the feedback path; and
a second transistor set configured as an inverter or buffer, wherein at least one of the weakly on transistors is in series with at least one transistor in the second transistor set and the first transistor set and the second transistor set do not receive the clock signal.

13. The method of claim 7 wherein the feedback path not receiving the clock signal reduces power draw from a clock network which supplies the clock signal.

14. A latch for use in a flip-flop comprising:
a first transistor set configured as a switching element, the first transistor set configured to receive clock signals, from a clock network, and an input signal;
a second transistor set configured as first data buffer, the second transistor set configured to receive the input signal from the first transistor set, responsive to the clock signals, and create a latch output; and
a feedback path comprising a third transistor set in series with a resistor, the third transistor set configured as second data buffer such that the feedback path receives the latch output and generates a feedback signal which is provided to the first transistor set, wherein the resistor is selected to establish the feedback signal at a magnitude:
sufficiently large to maintain a state of the latch; and
sufficiently small to allow a change in the input signal to change the state of the latch.

15. The latch of claim 14 wherein the resistor replaces two switching transistors which reduces power draw from a clock network, which generates the one or more clock signals.

16. The latch of claim 14 wherein first data buffer and the second data buffer comprise inverters.

17. The latch of claim 14 further comprising a second latch wherein the latch of claim 14 and the second latch form a D flip-flop.

18. The latch of claim 14 wherein the magnitude of the feedback signal is 50% of a supply voltage for the latch.

19. The latch of claim 14 wherein the latch has only two transistors which receive the clock signals.

* * * * *